(12) United States Patent
Nonogaki et al.

(10) Patent No.: US 8,593,048 B2
(45) Date of Patent: Nov. 26, 2013

(54) ELECTRON SOURCE HAVING A TUNGSTEN SINGLE CRYSTAL ELECTRODE

(75) Inventors: Ryozo Nonogaki, Shibukawa (JP); Toshiyuki Morishita, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/695,625

(22) PCT Filed: Nov. 30, 2010

(86) PCT No.: PCT/JP2010/071340
§ 371 (c)(1),
(2), (4) Date: Nov. 1, 2012

(87) PCT Pub. No.: WO2011/142054
PCT Pub. Date: Nov. 17, 2011

(65) Prior Publication Data
US 2013/0049568 A1  Feb. 28, 2013

(30) Foreign Application Priority Data
May 10, 2010  (JP) .................................. 2010-108681

(51) Int. Cl.
*H01J 1/304*  (2006.01)
(52) U.S. Cl.
USPC ............. 313/310; 313/309; 313/311; 445/50; 445/51
(58) Field of Classification Search
CPC ............. H01J 1/13; H01J 9/02; H01J 37/073; G01R 1/67
USPC .................. 313/336, 346 R, 362.1, 310, 309; 250/423
See application file for complete search history.

(56) References Cited

U.S. PATENT DOCUMENTS

| 4,379,250 | A | 4/1983 | Hosoki et al. | |
| 7,969,080 | B2 * | 6/2011 | Terui et al. | 313/326 |
| 8,436,524 | B2 * | 5/2013 | Terui et al. | 313/336 |
| 2008/0174225 | A1 | 7/2008 | Tessner et al. | |
| 2010/0026160 | A1 * | 2/2010 | Terui et al. | 313/308 |
| 2011/0089336 | A1 * | 4/2011 | Kasuya et al. | 250/424 |
| 2012/0169210 | A1 * | 7/2012 | Morishita | 313/310 |

FOREIGN PATENT DOCUMENTS

| JP | 56-61733 | A | 5/1981 |
| JP | 6-12972 | A | 1/1994 |
| JP | 6-76731 | A | 3/1994 |
| JP | 7-78552 | A | 3/1995 |
| JP | 2005-186175 | A | 7/2005 |
| JP | 2008-181876 | A | 8/2008 |
| JP | 2008-270017 | A | 11/2008 |
| JP | 2009-205800 | A | 9/2009 |
| WO | 2007/148507 | A1 | 12/2007 |
| WO | 2009-153939 | A1 | 12/2009 |

OTHER PUBLICATIONS

International Search Report of PCT/JP2010/071340 dated Jan. 11, 2011.

* cited by examiner

*Primary Examiner* — Tracie Y Green
(74) *Attorney, Agent, or Firm* — Roberts Mlotkowski Safran & Cole P.C.

(57) ABSTRACT

Provided are an electron source which allows a high-angle current density operation even at a low extraction voltage, and reduces excess current that causes vacuum deterioration; and an electronic device using the electron source. The electron source has a cathode composed of single-crystal tungsten, and a diffusion source provided in the intermediate portion of the cathode. In the cathode, the angle between the axial direction of the cathode and <100> orientation of the cathode is adjusted so that electrons to be emitted from the vicinity of the boundary between surface and surface formed on the tip of the cathode, are emitted substantially parallel to the axis of the cathode. The electronic device is provided with the electron source.

4 Claims, 7 Drawing Sheets

ELECTRON SOURCE HAVING A TUNGSTEN SINGLE CRYSTAL ELECTRODE

TECHNICAL FIELD

The present invention relates to an electron source for example for use in scanning electron microscopes, Auger spectrometers, electron beam exposure devices and wafer inspection systems.

BACKGROUND ART

Electron sources having a needle-shaped electrode of tungsten single crystal and a coat layer of zirconium and oxygen formed thereon (hereinafter, referred to as ZrO/W electron sources) have been recently used to obtain a high-brightness electron beam having a life longer than hot cathodes (see Patent Documents 1 and 2).

In conventional ZrO/W electron sources, a coat layer of zirconium and oxygen (hereinafter, referred to as ZrO coat layer) is formed on a needle-shaped cathode of tungsten single crystal with its axis in the <100> direction.

When an electric field is applied to the cathode in that shape in vacuum apparatus, the electrostatic force as driving force causes mass migration toward the tip along the surface, forming a crystal face stabilized in surface energy on the cathode tip in the plane direction (100). The ZrO coat layer reduces the work function of the tungsten single crystal in the (100) plane from 4.5 eV to about 2.8 eV and makes only the fine crystal face formed in the tip region of the cathode in the (100) plane function as the electron emission region, and thus, such a device has an advantage that it can emit electron beam higher in brightness and yet it has longer life than conventional hot cathodes. It also has an advantage that it is more stabilized than cold-field-emission electron sources and easier to handle, as it operates even under milder vacuum.

In conventional ZrO/W electron sources, a needle-shaped tungsten cathode having the crystal face in the <100> direction and emitting electron beam is connected at a particular position to a tungsten filament formed on conductive terminals fixed to an electrical porcelain for example by welding. A supply source of zirconium and oxygen is formed locally on the cathode (for example, see FIG. 2). The surface of the cathode is covered with a ZrO coat layer.

Because conventional cathodes are used generally at a temperature of about 1800K, as the filament is heated under application of current, the ZrO coat layer on the cathode surface vaporizes. However, zirconium and oxygen are supplied to the cathode surface from the supply source continuously by diffusion, resulting in preservation of the ZrO coat layer.

In addition, the tip region of the cathodes used in conventional ZrO/W electron sources is placed and used in the region between a suppressor electrode and an extraction electrode (for example, see FIG. 3). A high voltage negative to the extraction electrode is applied to the cathode and a voltage negative to cathode of about hundreds of volts additionally to the suppressor electrode, thus suppressing emission of thermoelectrons from the filament.

CITATION LIST

Patent Documents

[Patent Document 1] Japanese Unexamined Patent Application Publication No. Hei 06-076731
[Patent Document 2] Japanese Unexamined Patent Application Publication No. Hei 06-12972

SUMMARY OF INVENTION

Technical Problem

Conventional ZrO/W electron sources have been used at an angular current density of 0.1 to 0.2 mA/sr, because, in length-measuring SEMs and wafer inspection systems, which operate at low accelerating voltage, the probe current is stabilized and expansion of the energy width can be prevented.

Generally, because throughput is emphasized for example for electron beam lithography systems, Auger spectrometers and wafer inspection systems, they are operated at a high angular current density of about 0.4 mA/sr. Operation at further higher angular current density is desired in such applications emphasizing throughput, and operation at a high angular current density of 1.0 mA/sr may also be required.

Operation at somewhat higher angular current density is possible with conventional ZrO/W electron sources, if the curvature radius of the cathode tip is increased from normal size of about 0.5 µm to about 1.0 µm and the (100) crystal face is grown larger.

However, because (1) the angular current density allowable is at most about 1.0 mA/sr and (2) the extraction voltage applied then between the cathode and the extraction electrode is large at 5 kV or more and a strong electric field is applied to the terminal of the (100) crystal face, undesired dump current from the (100) crystal face terminal increases in quantity. In practice when the total current emitted from the cathode increases, it causes vacuum deterioration by the gas released from surrounding materials, possibly leading to instabilization of current and undesired electric discharge (see Comparative Example below).

Accordingly, a main object of the present invention is to provide an electron source satisfying the technical requirements that it should operate at high angular current density without increase in extraction voltage and the amount of the dump current causing vacuum deterioration should be reduced in a well-balanced manner and an electron beam apparatus employing the same.

Solution to Problem

In the present invention, which was made to solve the above-described technical problems known in the art, the inventors have found that it is possible, by adjusting the angle of the cathode to the <100> direction in a particular range, to emit the strong electron beam from the terminal of the (100) crystal face, which was hitherto considered undesirable dump current in traditional technology, in the direction almost in parallel with the cathode axis, and made the present invention. It also became possible in this way to provide a technology that can satisfy in a well-balanced manner both the technical requirements: (1) the device should operate at a high angular current density of 1.0 mA/sr or more even without increase in extraction voltage and (2) the amount of the dump current, which leads to vacuum deterioration, should be suppressed.

Thus, the present invention provides an electron source having a cathode of tungsten single crystal and a diffusion source formed on the central region of the cathode, wherein The angle between the axial direction of the cathode and the <100> direction of the cathode is adjusted so that the electron emitted from the boundary region between the (100) and (110) planes formed on the cathode tip is directed almost in parallel with the axis of the cathode.

The angle between the axial direction of the cathode and the <100> direction of the cathode is preferably 22.5±10°.

The crystal orientation in the axial direction of the cathode is preferably in the <310> direction.

The diffusion source above preferably contains at least zirconium oxide.

The present invention also provides an electron beam apparatus, comprising an electron source having a cathode of tungsten single crystal and a diffusion source formed on the central region of the cathode, wherein the angle between the axial direction of the cathode and the <100> direction of the cathode is adjusted so that the electron emitted from the boundary region between the (100) and (110) planes formed on the cathode tip is directed almost in parallel with the axis of the cathode.

Preferably, the angle between the axial direction of the cathode and the <100> direction of the cathode is 22.5±10° or the crystal orientation in the cathode axial direction is in the <310> direction.

The electron beam apparatus is preferably an electron beam lithography system, Auger spectrometer or wafer inspection system.

Advantageous Effect of Invention

It is possible according to the present invention to provide an electron source that satisfies the technical requirements that the apparatus should operate at high angular current density without increase in extraction voltage and the amount of the dump current that causes vacuum deterioration should be reduced in a well-balanced manner and also to provide an electron beam apparatus employing the same.

DESCRIPTION OF EMBODIMENTS

Hereinafter, typical embodiments and operational advantages of the present invention will be described with reference to FIGS. 1 to 4.

A typical embodiment of the present invention will be described in the present embodiment, and thus, the present invention is not to be construed narrower in scope by this embodiment. Hereinafter, an electron source favorable for use in electron beam apparatuses (electron beam-applied devices) such as scanning electron microscopes, Auger electron spectrometers, electron beam exposure devices and wafer inspection systems will be described.

Figure 2:
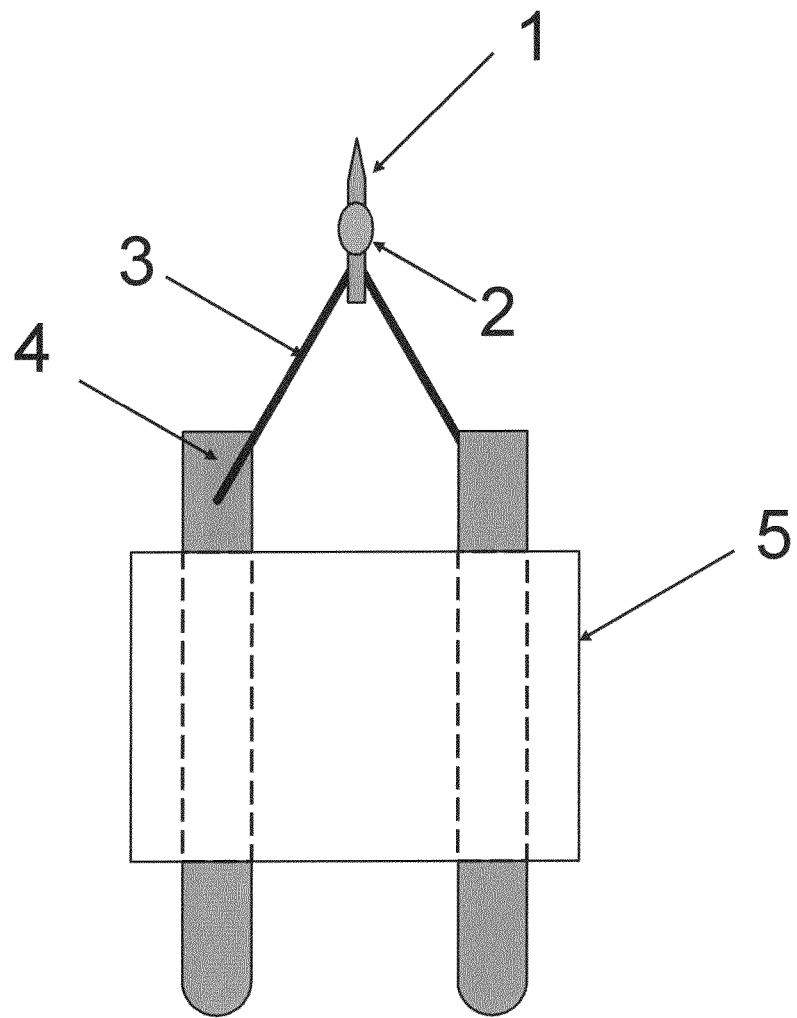
FIG. 2 is a structural view illustrating a ZrO/W electron source.

As shown in FIG. 2, the electron source according to the present invention comprises an electrical porcelain 5, two conductive terminals 4 connected to the electrical porcelain 5, a filament 3 connected to both of the conductive terminals 4, a rod-shaped cathode 1 connected to the filament 3, and a diffusion source 2 formed on the central region of the cathode 1.

Preferably, an electron beam-emitting needle-shaped tungsten cathode 1 is bonded, for example by welding, to the tungsten filament 3 that is connected to the conductive terminals 4 fixed to the electrical porcelain 5, at a particular position. A supply source 2 of zirconium and oxygen is preferably formed partially on the cathode 1 according to the present invention. In addition, the surface of the cathode 1 according to the present invention is preferably covered with a ZrO coat layer that is not shown in Figure.

Figure 3:
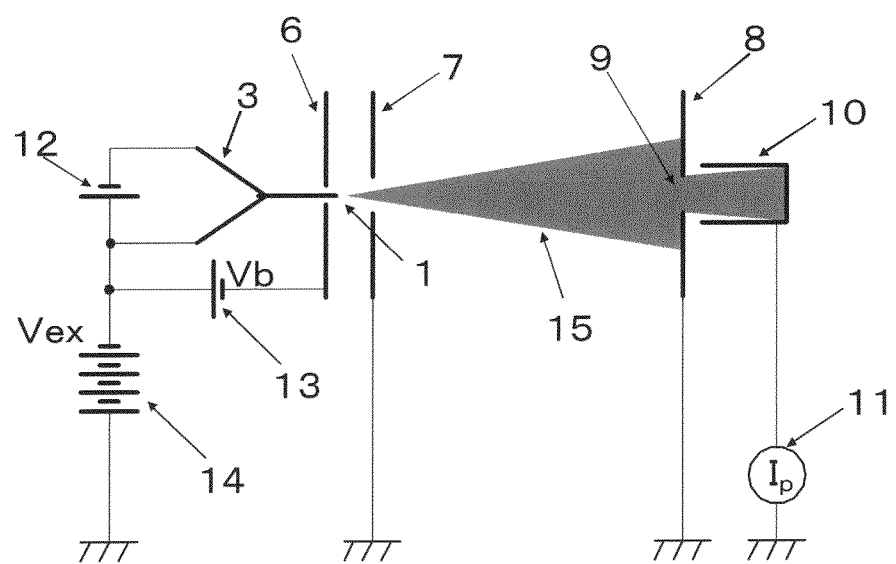
FIG. 3 is a chart showing the configuration of a device for evaluation of electron emission characteristics.

As shown in FIG. 3, the tip region of the cathode 1 of the electron source according to the present invention is used, as it is placed at the position between a suppressor electrode 8 and an extraction electrode 9. A high voltage negative to the extraction electrode 9 is applied to the cathode 1 and a voltage of about hundreds of volts negative to the cathode 1 is applied to the suppressor electrode 8, for suppression of emission of thermoelectrons from the filament 3.

The electron source according to the present invention has a cathode 1, of which the angle between the axial direction and the <100> direction thereof is adjusted so that the electrons emitted from the boundary region between the (100) plane and the (110) plane formed on the cathode tip are directed almost in parallel with the axis of the cathode.

Figure 4:
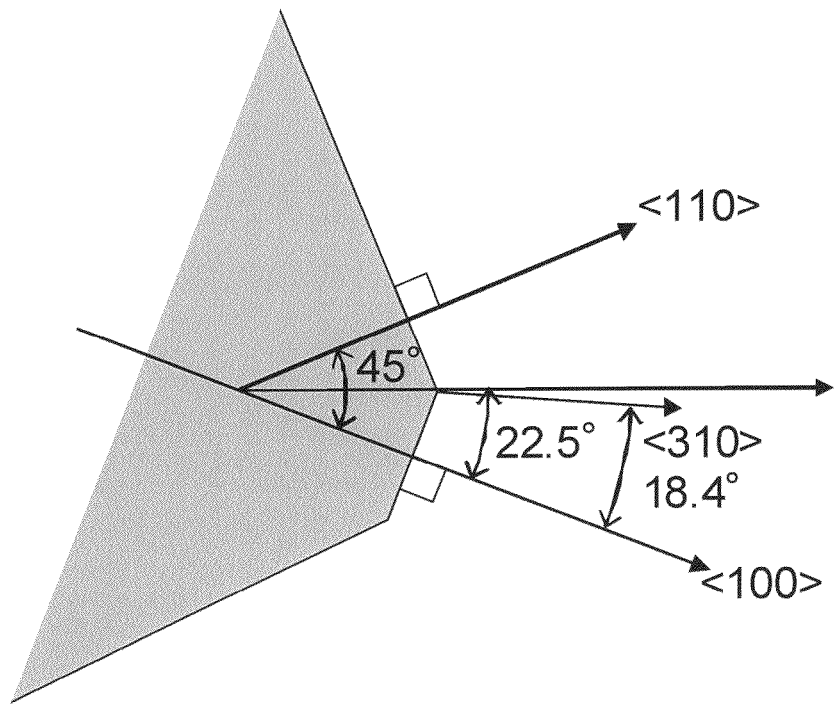
FIG. 4 is a schematic view illustrating the tip of the cathode in Example.

FIG. 4 is a schematic view illustrating a cathode tip of the electron source in the present embodiment of the present invention.

Figure 1:
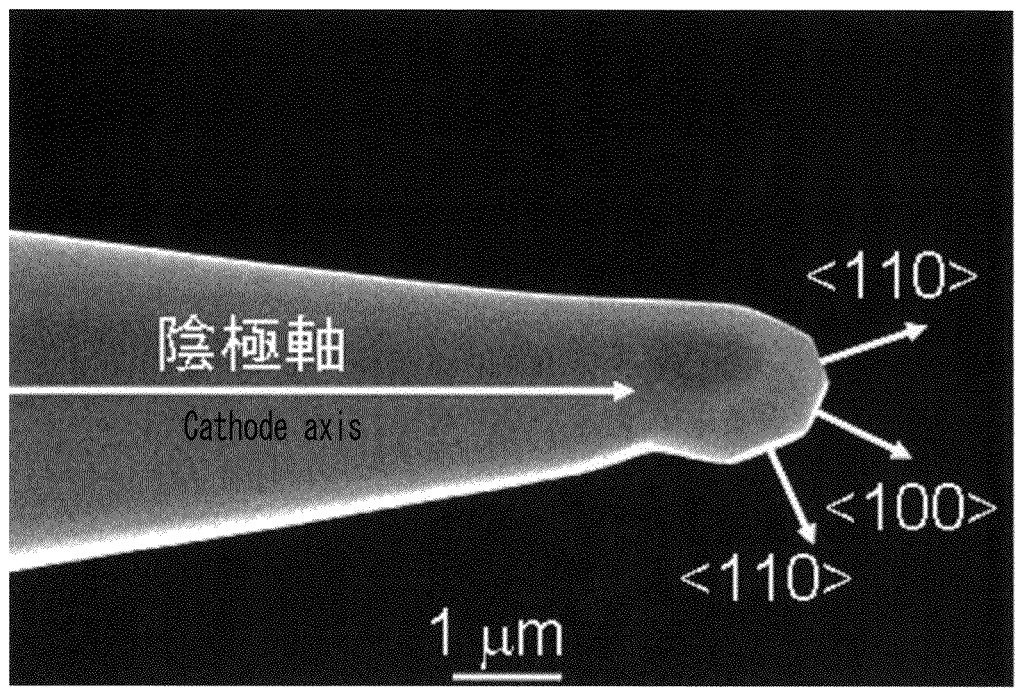
FIG. 1 is an electron micrograph showing the cathode tip used in Example.

When electric field is applied to the cathode material for use in the present invention in a vacuum apparatus, it causes mass migration along the surface toward the tip, by the electrostatic force acting as driving force, forming on the cathode tip (100) and (110) crystal faces close to each other stabilized in surface energy (for example, see FIG. 1).

The work function of the (100) plane is reduced by the coat layer formed by diffusion from the diffusion source formed on the central region of the cathode, permitting emission of electrons from the (100) plane. The (100) and (110) planes form a boundary then at a particular angle, and the electric field strength increases more in the boundary region than in the flat area of the (100) plane, permitting emission of electrons from the boundary region at high angular current density. Because the angle between the (100) plane and the direction normal to the (110) plane is 45°, electrons are emitted at higher strength, in the boundary region, in the direction of the bisector of the respective normal directions, i.e., in the direction at an angle of 22.5° from the <100> normal direction (see FIG. 4).

Thus, it is possible, by using a tungsten single crystal prepared to have its cathode axis at an angle of 22.5° from the <100> direction as cathode material, to make the electrons emitted from the boundary region between (100) and (110) planes directed almost in parallel with the axis of the cathode. In practice, it is possible to obtain the advantageous effects of the present invention sufficiently, if the angle between the cathode axial direction and the <100> direction is 22.5°±10°. In other words, even if angle of the cathode axis from the <100> direction deviates from 22.5° to some extent, electrons pass in the direction almost vertical to the extraction electrode face, as withdrawn by the extraction electrode directly facing the cathode. Thus when the angle of the cathode axial direction from the <100> direction is 22.5°±10°, it is possible to correct the angular deviation easily if there is a mechanism installed in the apparatus, for electrical or mechanical manipulation of electron orbit externally.

In addition, it is preferable to use a tungsten single crystal cathode prepared with the axis inclined at an angle of 18.4°±3° and more preferable to use a single crystal tungsten cathode in which the crystal orientation in the cathode axial direction is in the <310> direction, as the tungsten single crystal cathode prepared to have an angle of the cathode axial direction from the <100> direction at 22.5°±10°.

As shown in FIG. 4, the angle between the <310> direction and the <100> direction is 18.4° and if it is approximately 18.4°±3°, it is in the range of 22.5°±10°, and thus, such a device provides the advantageous effects of the present invention. Further, a single crystal tungsten in the <310> direction is also advantageous in that it is possible to determine the direction and adjust the direction during preparation of the single crystal easily, for example, by X-ray diffraction.

Hereinafter, the method of producing the electron source according to the present invention will be described.

A cathode 1 of tungsten single crystal (cathode material) prepared with the axial direction inclined at an angle of 22.5°±10° to the <100> direction is bonded to conductive terminals 4 brazed to an electrical porcelain 5 via a tungsten filament 3 by welding, to make it heatable by application of current and the tip region of the cathode 1 is sharpened by electropolishing. The tip region of the cathode 1 is preferably sharpened then to a cathode tip curvature radius of 0.2 to 1.0 µm, more preferably of 0.4 to 0.6 µm.

For example, zone-melting recrystallization method is known as the method of producing a cathode material such as tungsten single crystal. In the present invention, it is possible, for example, to use a single crystal produced by the method above and process it mechanically into a wire material.

A supply source of metal and oxygen, which has a function to reduce the work function of the electron-emitting face, is formed on the cathode 1.

A supply source of metal and oxygen, such as metal oxide, is dispersed in an organic solvent (such as isoamyl acetate) used as dispersion medium. The mixture is pulverized and homogenized, for example in a mortar, into a slurry, which is then applied. After the application, electric current is applied to the filament 3 under an extreme vacuum at 2 to $4 \times 10^{-10}$ Torr (3 to $5 \times 10^{-8}$ Pa), heating the cathode 1 up to 1700 to 1900K. Subsequently, oxygen gas is introduced into the system, and the metal is oxidized under an oxygen atmosphere at 2 to $4 \times 10^{-6}$ Torr (3 to $5 \times 10^{-4}$ Pa), forming a supply source of metal and oxygen.

An electron source having a supply source of a metal oxide containing one or more elements selected from the group consisting of zirconium (Zr), titanium (Ti), hafnium (Hf), scandium (Sc), yttrium (Y), lanthanoid series elements, barium (Ba), strontium (Sr) and calcium (Ca) can be used favorably as an electron source for hot-cathode field-emission electron sources. In particular, a zirconium oxide-containing supply source is preferable, as it can emit electrons reliably at an operating temperature of 1800K, when used.

For example in the case of zirconium oxide, a paste of zirconium hydride pulverized and mixed with an organic solvent is applied partially on a cathode, the cathode is heated under an oxygen atmosphere at about $3 \times 10^{-6}$ Torr ($4 \times 10^{-4}$ Pa) for thermal decomposition to $ZrH_2$. The cathode is further oxidized, to form a supply source of zirconium and oxygen.

The cathode 1 having the supply source formed thereon is then placed in the region between an extraction electrode 7 and a suppressor electrode 6, a high voltage of several kV (2 to 4 kV) negative to the extraction electrode 7 is applied to the cathode 1.

A voltage of hundreds of volts (−200 to −400V) negative to the cathode 1 is applied to the suppressor electrode 6 and the cathode 1 is heated to 1500 to 1900K (favorably, 1700 to 1900K) under the extreme vacuum described above. In this way, the (100) and (110) crystal faces, which are stabilized in surface energy, are formed close to each other on the cathode tip. The emission current becomes stabilized when the heat treatment is continued for several hours (about 1 to 4 hours).

The electrons emitted from the region close to the boundary between the (100) and (110) planes are directed almost in parallel with the cathode axis. It is thus possible to obtain an electron beam having a high angular current density of 1 mA/sr or more and to reduce the dump current that causes vacuum deterioration.

Therefore as the angle between the cathode axial direction and the cathode <100> direction is adjusted crystallographically and thermodynamically, it is possible to make the strong electron beam from the terminal of the (100) crystal face, which was considered to be undesirable dump current traditionally, emitted in the direction almost in parallel with the cathode axis and to apply an electron current at high angular current density to various electron beam apparatuses.

The electron source according to the present invention can be used in electron beam apparatuses (electronic devices) such as scanning electron microscopes, transmission electron microscopes, Auger spectrometers, surface analysis apparatuses, electron beam exposure devices and semiconductor wafer inspection systems.

Generally, because throughput is significantly important for example for electron beam lithography systems, Auger spectrometers and wafer inspection systems, they are operated at a high angular current density of about 0.4 mA/sr. Operation at further higher angular current density is desired in such applications demanding high throughput, and operation at an even higher angular current density of 1.0 mA/sr may also be required. For the reasons above, the electron source according to the present invention, which can operate even at a high angular current density of 1.0 mA/sr or more without increase in extraction voltage, can be used favorably, in particular, in electron beam lithography systems, Auger spectrometers and wafer inspection systems.

EXAMPLES

Hereinafter, the present invention will be described more in detail with reference to Examples, but it should be understood that the invention is not limited thereby.

Example

Hereinafter, Example 1 will be described, based on FIGS. 1 to 4.

A filament 3 of V-shaped tungsten wire having a diameter of 0.125 mm was fixed by spot-welding to a pair of conductive terminals 4 brazed to an electrical porcelain 5 shown in FIG. 2. A single crystal tungsten cathode 1 in the <310> direction was spot-welded to the filament 3. The tip of a cathode 1 was then sharpened to a tip curvature radius of 0.5 µm by electropolishing.

A diffusion source 2 shown in FIG. 2 is placed on the region close to the center of the tungsten single crystal cathode 1. A paste of a mixture of pulverized zirconium hydride and isoamyl acetate was coated locally on the cathode 1. After vaporization of isoamyl acetate, the cathode was placed in an ultrahigh-vacuum apparatus. Subsequently, the apparatus was evacuated to an ultra-high vacuum of $3 \times 10^{-10}$ Torr ($4 \times 10^{-8}$ Pa), and the single crystal rod 1 was heated to 1800K by application of voltage to the filament 3 for thermal decomposition of zirconium hydride into metal zirconium. Oxygen gas was then fed into the apparatus to a pressure of $3\times10^{-6}$ Torr ($4\times10^{-4}$ Pa) for oxidation of the metal zirconium, to give a diffusion source 2 of zirconium and oxygen (zirconium oxide).

As shown in the vacuum apparatus of FIG. 3, the tip of the cathode 1 obtained was placed at a position between suppressor electrode 6 and extraction electrode 7. The distance between the tip of the cathode 1 and the suppressor electrode 6 was adjusted to 0.25 mm and the distance between the suppressor electrode 6 and the extraction electrode 7 to 0.6 mm, and the pore size of the extraction electrode 7 was adjusted to 0.6 mm and the pore size of the suppressor electrode 6 to 0.4 mm. In addition, both terminals of the filament 3 were connected to a filament-heating power source 12, which was in turn connected to a high-pressure power source 14. Alternatively, the suppressor electrode 6 was connected to a bias power source 13.

The measurement apparatus was evacuated to an ultra-high vacuum of $3\times10^{-10}$ Torr ($4\times10^{-8}$ Pa) and the filament current was controlled, by measurement with a radiation thermometer, to make the cathode temperature adjusted to 1800K when electron emission started. A bias voltage Vb of $-300$ V with respect to the cathode 1 was applied to the suppressor electrode 6, thus suppressing the thermal electrons emitted from the filament 3. A high voltage negative to the extraction electrode 7, i.e., extraction voltage Vex, was thereafter applied to the cathode 1. The electron beam 15 emitted from the tip of the cathode 1 advances through the hole of the extraction electrode 7 and reaches radioscopic screen 8. The radioscopic screen 8 has an aperture (small opening) 9 at the center and the probe current Ip passing through the hole and reaching cup-shaped electrode 10 is quantified with a microammeter 11. When the solid angle, which is calculated from the distance between the aperture 9 and the tip of cathode 1 and the internal diameter of the aperture 9, is designated as $\omega$, the angular current density is defined as Ip/$\omega$. The aperture 9 and the cup-shaped electrode 10 were formed movable externally from out of the vacuum system, for measurement of the angular current density distribution.

Figure 5:
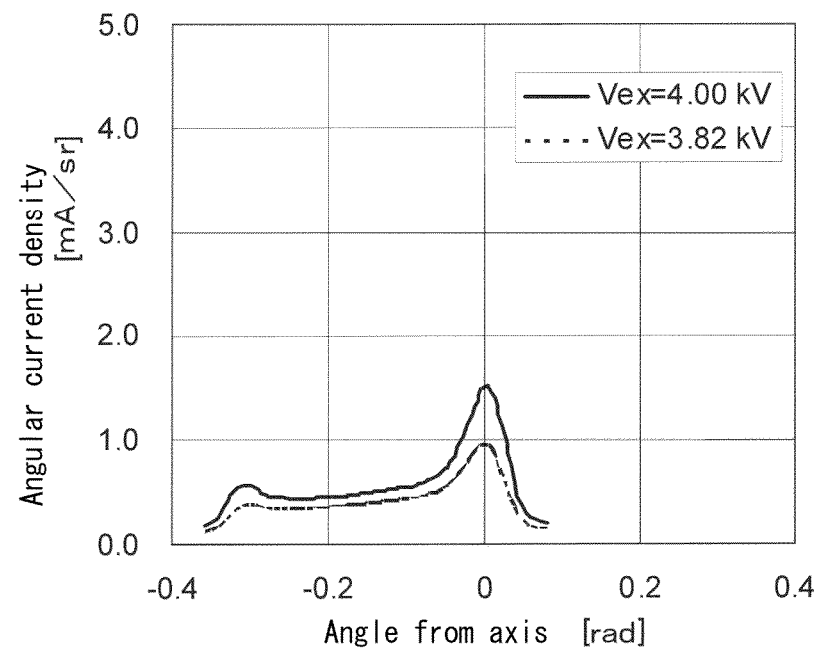
FIG. 5 is a graph showing the angular current density distributions in Example.

After storage for several hours and stabilization of the emission current, the change in probe current Ip when the aperture 9 was moved was measured for determination of the angular current density distribution. The results of the angular current density distribution measurement when extraction voltages Vex's of 4.00 kV and 3.82 kV were applied to the extraction electrode 7 are shown in FIG. 5. Alternatively, the extraction voltage when the angular current density along the axis is 1 mA/sr and the entire current (total current) emitted then from the cathode 1 are shown in Table 1. In addition, the electron micrograph of the cathode tip of the electron source of the Example after test is shown in FIG. 1.

Comparative Example

Figure 6:
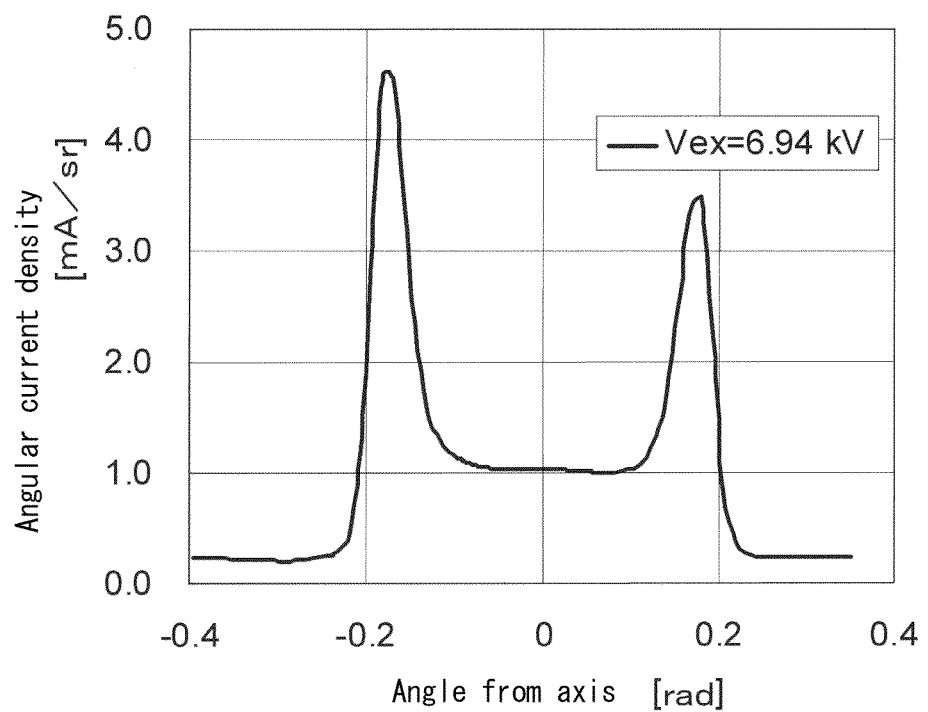
FIG. 6 is a graph showing the angular current density distribution in Comparative Example.
Figure 7:
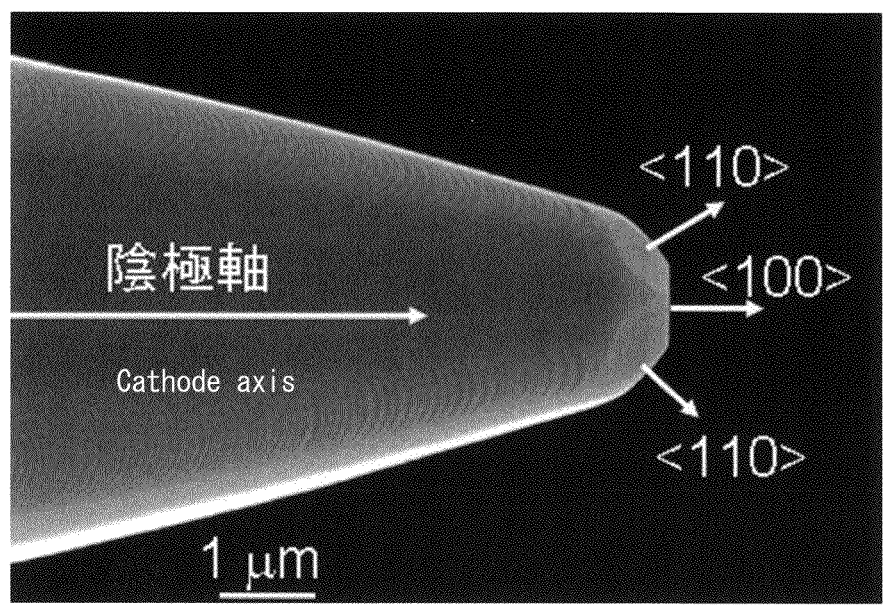
FIG. 7 is an electron micrograph showing the cathode tip used in Comparative Example.

The angular current density distribution was determined by a method similar to the Example above using an electron source prepared by the same production method as that in the Example, except that a single crystal tungsten in the <100> direction was used as the cathode 1 and the cathode tip region was sharpened to an tip curvature radius of 1.0 μm by electropolishing. The results of the angular current density distribution measurement when an extraction voltage Vex of 6.94 kV was applied to the extraction electrode 7 are shown in FIG. 6. Alternatively, the extraction voltage when the angular current density along the axis is 1 mA/sr and the entire current (total current) emitted then from the cathode 1 are shown in Table 1. In addition, the electron micrograph of the cathode tip of the electron source of the Comparative Example after test is shown in FIG. 7.

TABLE 1

|  | Extraction voltage when the angular current density along the axis is 1 mA/sr | Total current when the angular current density along the axis is 1 mA/sr |
|---|---|---|
| Example | 3.82 kV | 192 μA |
| Comparative Example | 6.94 kV | 636 μA |

<Discussion of the Results Obtained in Example and Comparative Example>

From the electron micrographs of the cathode tips of Example and Comparative Example respectively shown in FIGS. 1 and 7, the presence of (100) and (110) crystal faces formed was clearly confirmed. It was also confirmed that the direction normal to the (100) crystal face of Comparative Example cathode is almost in parallel with the axis direction, while the angle between the direction normal to the (100) crystal face of Example cathode and the axis of the cathode is about 20°. The angular current density distribution of Example shown in FIG. 5 shows that there are two maximum points in angular current density, which correspond to electron radiations emphasized by application of strong electric field to both terminals in the (100) crystal face. One of the maximum points in angular current density is positioned almost on the axis, and it is possible in such an electron beam apparatus to use the region where the angular current density is largest effectively. It is because the angle between the axial direction of the cathode and the <100> direction of the cathode is adjusted. It was also found that, even at an extraction voltage Vex of 4.0 kV, which is lower than 5 kV, operation at a high angular current density of 1.5 mA/sr is possible.

On the other hand, the angular current density distribution of Comparative Example in FIG. 6 shows that there are two maximum points in angular current density, similarly to Examples, but electron emission occurs both from the two positions at a radian angle of about 0.2 from the axis, indicating that the maximum regions cannot be used effectively in the electron beam apparatus. In addition when the angular current density along the axis is 1 mA/sr, the extraction voltage Vex is 6.94 kV, which is larger than 5 kV.

The entire currents (total currents) emitted from the cathode 1 at the extraction voltage when the maximum value of the angular current density distribution along the axis is 1 mA/sr in the Example and the Comparative Example are compared in Table 1. The total current in the Comparative Example was 66 μA, while that of the Example is lower at 192 μA, indicating that the device became resistant to vacuum deterioration caused by the gas released from surrounding devices and also to electric discharge, thus emitting electron beam more reliably.

Although the present invention has been described specifically with reference to favorable embodiments, these embodiments are only examples for description and there are various other possible modified embodiments and it would be obvious for those who are skilled in the art that such modified embodiments are also included in the scope of the present invention.

REFERENCE SIGNS LIST

1: Cathode
2: Supply source
3: Filament
4: Conductive terminal
5: Electrical porcelain
6: Suppressor electrode
7: Extraction electrode
8: Radioscopic screen
9: Aperture
10: Cup-shaped electrode
11: Microammeter for measurement of probe current
12: Filament-heating power source
13: Bias power source
14: High-pressure power source
15: Electron beam emitted

The invention claimed is:

1. An electron source having a cathode of tungsten single crystal and a diffusion source formed on the central region of the cathode, wherein the angle between the axial direction of the cathode and the <100> direction of the cathode is adjusted so that the electrons emitted from the boundary region between the (100) and (110) planes formed on the cathode tip is directed almost in parallel with the axis of the cathode, wherein the angle between the axial direction of the cathode and the <100> direction of the cathode is 22.5±10°, and the crystal orientation in the axial direction of the cathode is in the <310> direction, and the boundary region between the (100) and (110) planes is formed on the cathode tip at an angle that causes electrons to be emitted at a higher angular current density in the boundary region.

2. The electron source according to claim 1, wherein the diffusion source contains at least zirconium oxide.

3. An electron beam apparatus, comprising an electron source having a cathode of tungsten single crystal and a diffusion source formed on the central region of the cathode, wherein the angle between the axial direction of the cathode and the <100> direction of the cathode is adjusted so that the electron emitted from the boundary region between the (100) and (110) planes formed on the cathode tip is directed almost in parallel with the axis of the cathode, wherein the angle between the axial direction of the cathode and the <100> direction of the cathode is 22.5±10° and the crystal orientation in the cathode axial direction is in the <310> direction and the boundary region between the (100) and (110) planes is formed on the cathode tip at an angle that causes electrons to be emitted at a higher angular current density in the boundary region.

4. The electron beam apparatus according to claim 3, wherein the electronic device is an electron beam lithography system, Auger spectrometer or wafer inspection system.

* * * * *